United States Patent [19]
Ahlgren

[11] Patent Number: 5,189,297
[45] Date of Patent: Feb. 23, 1993

[54] PLANAR DOUBLE-LAYER HETEROJUNCTION HGCDTE PHOTODIODES AND METHODS FOR FABRICATING SAME

[75] Inventor: William L. Ahlgren, Goleta, Calif.

[73] Assignee: Santa Barbara Research Center, Goleta, Calif.

[21] Appl. No.: 237,806

[22] Filed: Aug. 29, 1988

[51] Int. Cl.$^5$ .................. H01J 40/14; H01L 27/14; H01L 31/18

[52] U.S. Cl. ............... 250/214.1; 250/370.13; 250/578.1; 437/3; 437/14; 437/16; 437/19; 257/441

[58] Field of Search ............ 437/3, 14, 16, 19; 250/211.3, 578, 370.13; 357/30

[56] References Cited

U.S. PATENT DOCUMENTS

| | | | |
|---|---|---|---|
| 4,105,478 | 8/1978 | Johnson | 437/3 |
| 4,206,003 | 6/1980 | Koehler | 437/3 |
| 4,318,758 | 3/1982 | Tien | 437/19 |
| 4,338,139 | 7/1982 | Shinada | 437/19 |

OTHER PUBLICATIONS

C. C. Wang et al., Proc. IRIS Detector, 1986, vol. II.
A journal article entitled, "Development of HgCdTe LWIR Heterojunction Mosaics", Proc. IRIS Detector, 1986, vol. II, Wang et al., pp. 255, 256.

Primary Examiner—Stephen C. Buczinski
Attorney, Agent, or Firm—W. C. Schubert; W. K. Denson-Low

[57] ABSTRACT

A double layer heterojunction array 10 of IR photodiodes has formed within an upper planar surface region of a collector layer 16 a plurality of isolation junctions 20 which are disposed between individual photodiodes. The isolation junctions are formed by a thermally driven process of type-converting the p-type or n-type collector layer to the opposite type of material. This type conversion forms p-n homojunctions at the edges of the isolation junctions which isolate the individual photodiodes one from another. The type-conversion process of the invention provides two isotype junctions which together reflect excess minority charge carriers away from the surface of the device as well as from neighboring photodiodes. One method of the invention discloses the selective annealing of the surface of an n-type collector layer to extract mercury atoms thereby creating mercury vacancies which act as acceptors. Other methods disclose the type conversion as being accomplished by the selective diffusion of a dopant layer into the collector layer.

27 Claims, 2 Drawing Sheets p on n DLHJ ARRAY n on p DLHJ ARRAY

PLANAR DOUBLE-LAYER HETEROJUNCTION HGCDTE PHOTODIODES AND METHODS FOR FABRICATING SAME

FIELD OF THE INVENTION

This invention relates generally to mercury-cadmium-telluride (HgCdTe) photodiodes and, in particular, relates to long wavelength infrared radiation (LWIR) HgCdTe photodiodes having a planar structure and isolation junction regions which isolate the individual photodiodes from one another.

BACKGROUND OF THE INVENTION

Presently most LWIR HgCdTe photodiodes are double layer heterojunction (DLHJ) structures which are fabricated by etching a plurality of mesas to isolate the individual photodiodes of an array of photodiodes. However, the resulting non-planar surface which results from the mesa etch has been found to be difficult to passivate. Such passivation is generally applied as a layer over the surface of the mesa structures in order to control surface states. The non-planar surface is also less stable than a planar surface due to non-uniform surface coverage and relatively poor adhesion of the passivation layer to the underlying material. Furthermore, in a mesa structure the active narrow bandgap/wide bandgap p-n junction intersects the surface of the device by being exposed along the mesa walls. Thus, the junction is exposed to enhanced thermally generated pair (g-r) noise associated with surface states and to flat-band voltage shifts which result from uncontrolled charges in the overlying passivation layer.

Another problem associated with conventional mesa-type structures is that the array of photodiodes must be removed from a growth chamber in order to etch the individual mesas. Thus, the fabrication of these conventional devices is more complex and costly. Also, inasmuch as the device must be removed from the controlled atmosphere of the growth chamber in order to etch the mesas, there is increased susceptibility to surface contamination and other undesirable factors which may influence the noise and spectral response of the resulting array.

In a journal article "Development of HgCdTe LWIR Heterojunction Mosaics", Proc. IRIS Detector, 1986, Vol II, Wang et al. discuss at pages 255, 256 and show in FIG. 8 a p-on-n LWIR planar detector grown by LPE which has individual diodes delineated by ion-implantation. Wang does not teach a thermally driven delineation process nor a process amenable to in-situ execution within a growth chamber. Furthermore, ion-implantation may induce implant-damage related noise effects.

It is thus one object of the invention to provide for an array of LWIR HgCdTe photodiodes which has a planar surface as opposed to a non-planar surface, the individual photodiodes being delineated in-situ within a growth chamber.

It is another object of the invention to provide an LWIR HgCdTe array of photodiodes which has improved surface coverage and adhesion to an overlying passivation layer or layers, the passivation layer also being deposited in-situ.

It is another object of the invention to provide an LWIR HgCdTe array of photodiodes wherein the active narrow bandgap/wide bandgap p-n heterojunction is not exposed at the surface of the array thereby improving the noise characteristics of the photodiodes.

It is still one further object of the invention to provide a method of fabricating an array of photodiodes which provides for isolating the individual photodiodes of the array in-situ within a reactor following double-layer deposition.

It is still one further object of the invention to provide a planar double-layer heterojunction photodiode structure which comprises four distinct junctions, two heterotype and two isotype, certain of these junctions defining an isolation junction region which is formed in a collector layer and possibly a base layer by a thermally driven method of selective type-conversion, the isolation junction region physically and electrically isolating individual photodiodes of the array one from another.

SUMMARY OF THE INVENTION

The above set forth problems are overcome and the objects of the invention are realized by an array of photodiodes constructed in accordance with the invention wherein the array has formed within an upper surface region a plurality of isolation junctions which are disposed between individual photodiodes. Further in accordance with the invention these isolation junctions are formed by type-converting the p-type or n-type collector layer to the opposite type of material. This type conversion forms p-n homojunctions at the edges of the isolation junctions which isolate the individual photodiodes one from another. A thermally driven type-conversion process of the invention simultaneously creates two isotype junctions which together reflect excess minority charge carriers away from the surface of the device as well as from neighboring photodiodes. The type conversion may be accomplished by a selective anneal of the collector layer or by the selective diffusion of a dopant into the collector layer. The anneal and diffusion are preferably accomplished by selectively illuminating the surface of the collector layer with a source of radiation having a wavelength or wavelengths which are strongly absorbed by the collector layer for heating the collector layer.

In accordance with one aspect of the invention there is disclosed an array of radiation responsive photodiodes which includes a base layer having a first type of electrical conductivity, the base layer being responsive to radiation for absorbing the radiation and generating charge carriers therefrom; a collector layer overlying the base layer, the collector layer having a second type of electrical conductivity for collecting charge carriers from the base layer, the interface of a top surface of the base layer and a bottom surface of the collector layer defining a photodiode heterojunction; and an isolation junction region thermally formed within at least the collector layer and having a shape operable for differentiating the photodiode heterojunction into a plurality of photodiode heterojunctions, the isolation junction region having an opposite type of conductivity from that of the collector layer.

In accordance with methods of the invention there is disclosed the steps of growing a radiation absorbing base layer having a first type of electrical conductivity; growing a collector layer over a surface of the base layer, the collector layer having a second type of electrical conductivity, the interface between the base layer and the collector layer defining a p-n or an n-p photodiode heterojunction; and differentiating the photodiode heterojunction into a plurality of photodiode heterojunctions. The step of differentiating is accomplished by converting portions of the collector layer to an opposite type of conductivity by a thermally driven technique, the converted portions defining an isolation junction region which physically and electrically isolates individual ones of the photodiode heterojunctions one from another.

BRIEF DESCRIPTION OF THE DRAWINGS

These and other aspects of the invention will be made more apparent in the following detailed description of preferred embodiments read in conjunction with the accompanying drawing wherein.

DETAILED DESCRIPTION OF PREFERRED EMBODIMENTS

Figure 1:
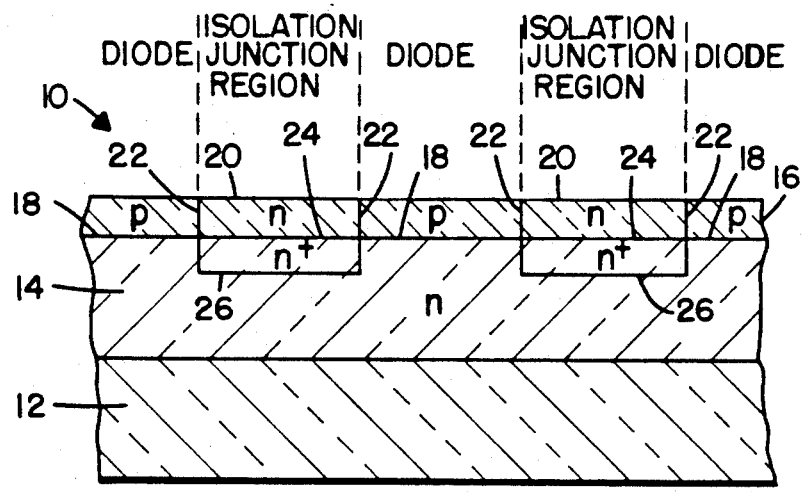
FIG. 1 shows in cross section (not to scale) a planar DLHJ photodiode array having a p-on-n configuration.

Referring to FIG. 1 there is shown in cross section (not to scale) an exemplary planar DLHJ HgCdTe photodiode array 10. Array 10 is comprised of a substrate layer 12 which may comprise cadmium-zinc-telluride (CdZnTe). Overlying substrate layer 12 is an n-type base layer 14 which may comprise narrow bandgap HgCdTe. Overlying base layer 14 is a relatively thin p-type collector layer 16 of substantially constant thickness which may comprise HgCdTe having a wider bandgap than the underlying base layer 14.

The intersection of the n-type base layer 14 and the overlying p-type collector layer 16 defines a plurality of p-n diode heterojunctions 18. Each of the junctions 18 defines a photodiode of the array of photodiodes. Although three photodiodes are shown in FIG. 1 it should be realized that a typical array may comprise hundreds or even thousands of such photodiodes which are typically disposed in a two dimensional array.

During operation radiation incident on the array of photodiodes is absorbed within the narrow bandgap base layer 14 whereby charge carriers are generated. The radiation may be incident on the backside of the array, passing through the transparent substrate 12 to be absorbed within the base layer 14 or the radiation may be incident upon the top surface. When coupled to a suitable source of bias majority charge carriers are collected by the p-type collector layer 18 resulting in a flow of diode current across the p-n junctions 18. This current is subsequently read out of the array by suitable electronics and the resulting signals are further processed. In order to isolate the individual p-n junctions from one another conventional arrays of such LWIR photodiodes typically have a plurality of mesa regions etched within the surface region such that portions of the collector layer 16 are etched away down into the base layer 14. As has been previously discussed, the resulting non-planar surface has been found to be difficult to passivate. Also, the p-n heterojunction is exposed along the side surfaces of the mesa walls, thereby exposing the junction to noise currents generated by surface states. It has also been known to delineate individual photodiodes by an ion-implantation process. However, ion-implantation is not an in-situ technique and also may induce implant damage related noise effects.

In accordance with the invention the array 10 has formed within an upper surface region a plurality of channels, or isolation junctions 20, which are disposed between individual photodiodes. Further in accordance with the invention these isolation junctions 20 are formed by type-converting the p-type collector layer to n-type material by a thermally driven process. There is thus formed p-n homojunctions at the edges of the isolation junctions 20 which isolate the individual photodiodes one from another. These homojunctions are indicated by the numerals 22. This type-conversion process of the invention creates two isotype junctions which together reflect excess minority charge carriers away from the surface of the device as well as from neighboring photodiodes. These two isotype junctions are shown as a nn+ heterojunction 24 which is formed between the base layer 14 and the collector layer 16 and also a n+n homojunction 26 which is formed in the base layer 26.

It has been found that if the collector layer 16 is made sufficiently thin, for example less than two microns, selected area type-conversion occurs in the manner shown. That is, the planar array surface region is intersected by the p-n isolation homojunctions 22 formed in the wide-bandgap collector material. The active p-n heterojunction 18, the base side of which is comprised of narrow-gap HgCdTe material, thus does not intersect the surface of the array 10. The active p-n junctions 18 are therefore isolated from surface noise effects and are also isolated one from another by the intervening isolation junctions 20. The first isotype heterojunction 24 advantageously forms a barrier which reflects excess minority carriers generated in the base layer 14 away from the surface of the device. The second isotype junction 26 is created if the type-conversion process extends sufficiently far down into the base layer 14. This second isotype junction 26 enhances the equilibrium majority-carrier concentration in the base layer 14 beneath the isolation junction 20. Thus, this second isotype homojunction 26 creates a barrier to the lateral flow of excess minority charge carriers between adjacent photodiodes in the array. This barrier to lateral minority carrier flow beneficially reduces cross-talk between adjacently disposed photodiodes.

It should be realized that the creation of the second isotype homojunction is optional in that so long as the type conversion occurs within at least the collector layer 16 the individual photodiodes are isolated from one another by the intervening isolation junctions 20. The creation of the second isotype homojunctions 26, which beneficially reduce cross talk between photodiodes, is a desirable, although not essential, feature of the invention.

Figure 2:
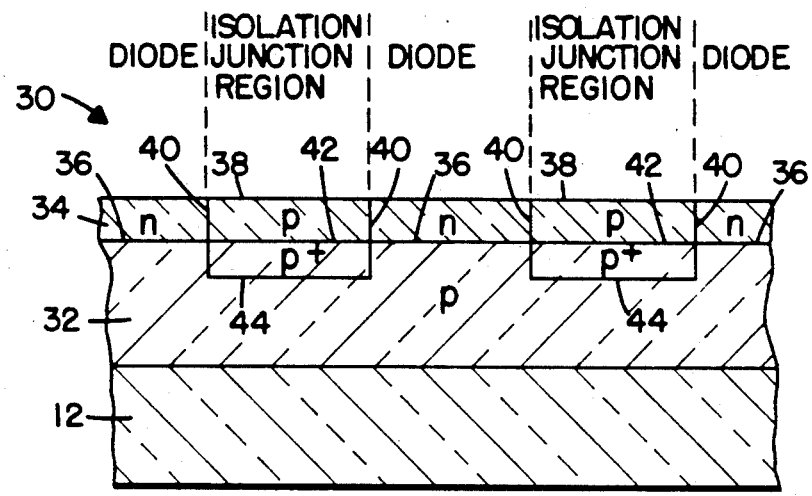
FIG. 2 shows a planar DLHJ photodiode array (not to scale) having an n-on-p configuration.

Referring now to FIG. 2 there is shown corresponding structure for an n-on-p DLHJ photodiode array 30 which comprises a substrate 12 which may comprise CdZnTe. Overlying substrate 12 is a p-type base layer 32 comprised of narrow bandgap HgCdTe. Overlying base layer 32 is a relatively thin n-type collector layer 34 which comprises wide bandgap HgCdTe. The interface of the p-type base layer 32 and the n-type collector layer 34 defines a plurality of n-p heterojunctions 36 which define the active area of the individual photodiodes of the array. In accordance with the invention there is formed within an upper surface region of the array 30 a plurality of channels, or isolation junctions 38, which are formed by a thermally driven selective type conversion of the underlying p-type collector layer 34 and possibly the underlying n-type base layer 32. As can be seen type conversion results in a p-type region formed within the collector layer 34 and a p+ region formed within the p-type base layer 32. The isolation junctions 38 advantageously isolate the individual photodiode junctions 36 one from an other. The presence of the isolation junctions 38 within the n-type collector layer 34 creates a plurality of n-p isolation homojunctions 40 within the collector layer 34. Furthermore, pp+ isotype heterojunction 42 is formed between the collector layer 34 and the base layer 32. Also, a p+p isotype homojunction 44 may be created within the base layer 32. This plurality of junctions function in accordance with the description previously given of the corresponding p-on-n DLHJ of FIG. 1.

There will now be described, in accordance with the invention, several methods of fabricating the planar-type DLHJ LWIR photodiode array of the invention.

Figure 3A:
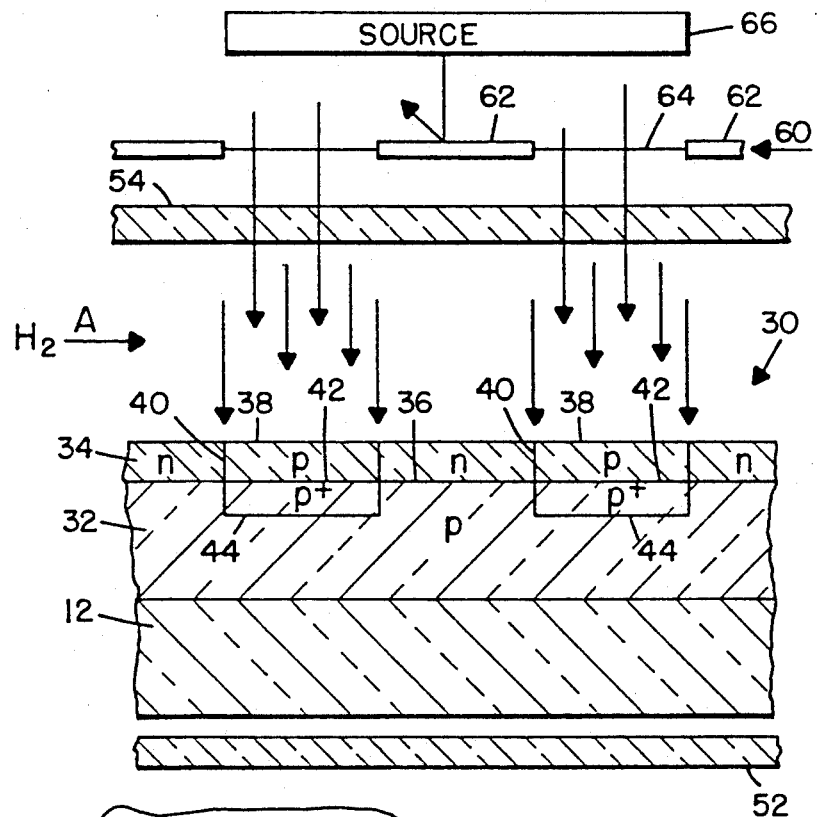
FIG. 3a shows a planar DLHG photodiode array disposed within an epitaxial growth reactor and a source of radiant energy being selectively applied to a surface of the array through a mask, selected portions of the surface region of the array being type converted by the radiation for forming photodiode isolation junctions within the surface region.
Figure 3B:
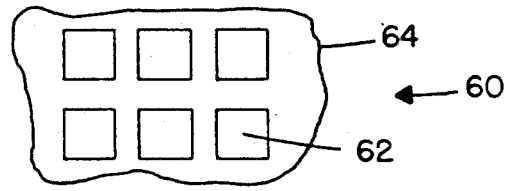
FIG. 3b shows a top view of the mask 60.

Referring now to FIGS. 3a and 3b thee is shown in cross-section a DLHJ array 50, similar to the array shown in FIG. 2, positioned within a growth chamber defined by reactor walls 52 and 54. Preferably the growth chamber is an MOCVD chamber although the methods of the invention may be practiced in other types of epitaxial growth apparatus. Reactor walls 52 and 54 may be comprised of any suitable refractory material, such as quartz. Preferably, at least a portion of the upper wall 54 is transparent to radiation within a predetermined range of wavelengths.

In accordance with one preferred method of the invention an n-type undoped collector layer 34 is grown on a p-type doped base layer 32. The collector layer 34 is grown such that it is preferably less than two microns thick. Without removing the double layer structure from the epitaxial reactor, a mask 60 is provided external to the reactor. As can be seen in the representative elevational view of FIG. 3b the mask 60 has a pattern imprinted thereon in the shape of the desired photodiode array 30. Where a photodiode is desired to be formed the mask 60 has a thin film structure 62 which is designed to be highly reflecting to radiation at a given wavelength. Where the isolation junction region 38 is desired to be formed the mask 60 has a region 64 which is highly transparent to the given wavelength. External to the reactor there is provided a high-intensity source 66 of radiation, such a pulsed laser, having a wavelength which is chosen for an optimum absorption profile in the collector and base layers 34 and 32, respectively. By example, the source 66 may be an excimer laser having a characteristic output wavelength of approximately 248 nm. Alternatively, the source 66 may be an arc lamp having output wavelengths selected for type converting the underlying HgCdTe material.

The result of the selective absorption of the radiation is to heat the isolation junctions without significantly heating the photodiode regions. This process, which may be known as selected-area laser annealing, is preferably performed in a vacuum or in an atmosphere of flowing pure hydrogen, indicated by the arrow A, such that thermally liberated mercury is extracted from the crystal lattice in the isolation junction regions but not in the diode regions. This extraction of mercury causes type-conversion of the undoped n-type collector material to p-type due to the formation of Hg-vacancies which act as acceptors. The photodiode regions which are shielded from the radiation by the reflective portion 62 of the mask 60 remain relatively cool and thus do not type-convert. The heating of the doped p-type base layer 32 beneath the isolation junctions converts the p-type material to p+ by the same mechanism, that is the creation of Hg vacancies. This type conversion creates the isotype homojunction 44 within the base layer 32.

The individual photodiode p-n junctions of the array 30 are thereby beneficially delineated and isolated one from another in-situ within the epitaxial reactor itself. Subsequently there is accomplished the deposition over the planar surface of the array 30 of a relatively thin passivation layer, the passivation layer comprising for example CdTe or ZnTe. The deposition of the passivation layer is also preferably performed before removing the array 30 from the reactor. After being passivated the array 30 is removed from the reactor and the array is typically overcoated with a layer of dielectric. Thereafter windows are opened to expose the upper surface of the photodiode detector regions. An ohmic contact with the detecting region is accomplished by the deposition of a relatively thick metal pad, the metal pad protecting the underlying thin collector layer from subsequent mechanical damage during bonding or hybridization. If desired, the window may be opened only through the dielectric layer to expose the CdTe passivation; the CdTe thereafter being heavily implanted with, for example, indium in order to make these regions of CdTe highly conducting. Thereafter the metal contact is applied to form an ohmic contact with the implanted CdTe regions, thereby conductively coupling the metal contact to the underlying collector regions.

Figure 4:
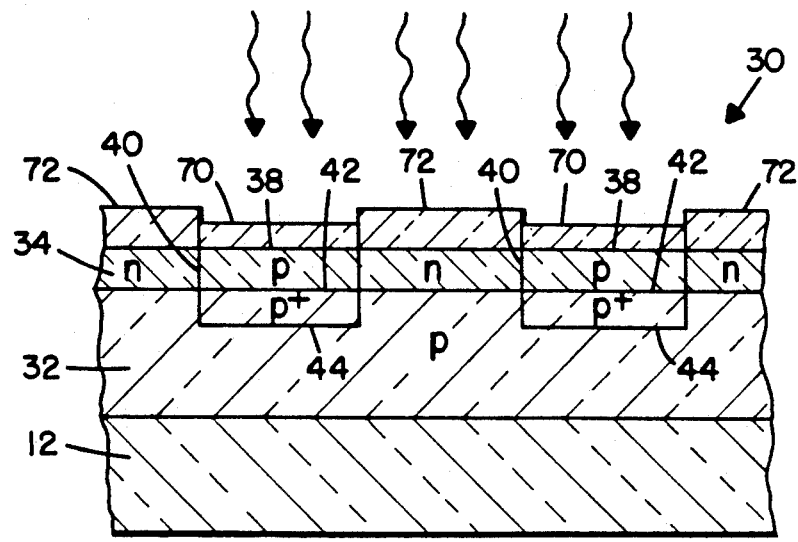
FIG. 4 illustrates another method of the invention wherein a DLHJ structure has a layer of dopant selectively applied to a surface, the dopant layer being diffused into the structure by a source of radiation for type converting the underlying material to form the isolation junction regions.

Referring to FIG. 4 there is illustrated another method of the invention wherein the array 30 is removed from the reactor before the step of selectively annealing. Prior to irradiating the surface a low energy, relatively shallow surface implanted region or an evaporated layer 70 of a p-type dopant, such as As or Au, may be formed on the surface of the isolation junctions 38, the photodiode regions being selectively masked 72 to prevent the deposition of the dopant layer 70 thereon. The dopant layer 70 may then be subsequently driven in and activated by the thermal energy applied during the annealing step, as previously described. After the creation of the isolation junctions 38 the mask layer 72 is removed and the fabrication of the array completed as previously described. Due to the low energy of the implanted ions minimal implant damage is sustained by the underlying collector layer 34.

In accordance with still another method of the invention, one that is especially applicable to p-on-n type structures as shown in FIG. 1, there is provided for an in-situ application of a layer comprised of an n-type dopant such as indium which is deposited at relatively low temperature from a reactant such as trimethyl indium. The deposition of the indium may be accomplished by the photo-assisted degradation of the trimethyl indium by a source of UV radiation applied through a mask, as illustrated in FIG. 3. After deposition, the indium layer is diffused into the structure by either the same or a different source of radiation. For example, a UV enhanced arc lamp may be employed for the photo-assisted deposition of the indium layer, while an excimer laser may be employed to drive the layer into the structure. Inasmuch as the mask 60 selectively occludes the radiation the desired array pattern is provided upon the surface of the array in-situ, the trimethyl indium being degraded and the subsequent deposition of the indium layer occurring on the array in those areas n registration with the portions 64 of the mask 60.

It can be seen that the methods of the invention provide for an LWIR heterojunction photodiode array which has a planar surface which is readily passivated by known techniques. Furthermore, it can be seen that in FIGS. 1 and 2 that the wide-gap p on narrow-gap n or wide-gap n on narrow-gap p photodiode heterojunctions 18 and 36, respectively, do not intersect the surface of the array but are instead buried at a depth of up to at least two microns beneath the surface. Thus, the photodiode heterojunctions involving narrow-gap material are not exposed to surface state noise sources resulting in a reduction in dark current and other noise currents The wide-gap p or wide-gap n homojunctions 22 which do intersect the surface are inherently less susceptible to such noise sources.

Figure 5:
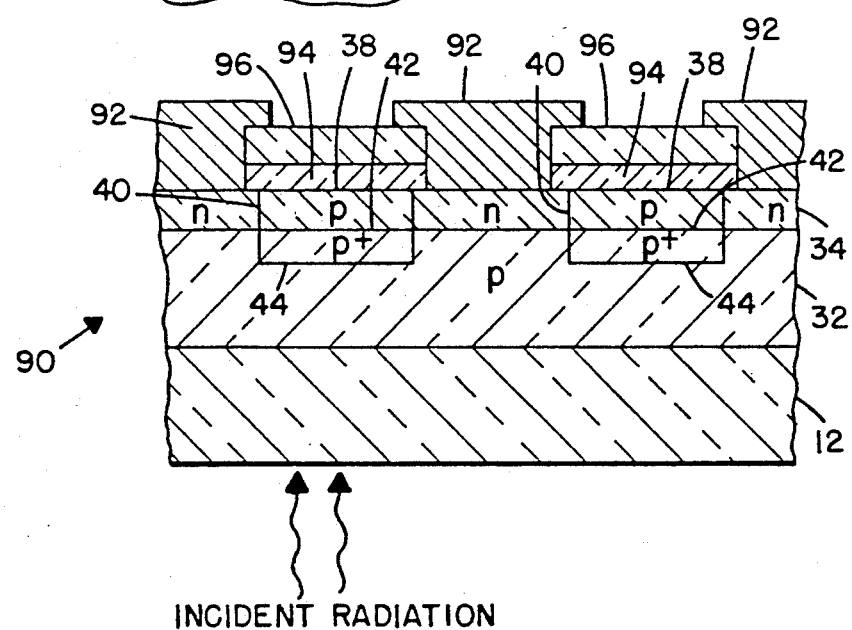
FIG. 5 shows in cross-section (not to scale) a portion of a completed planar array of backside illuminated, DLHJ photodiodes having isolation junction regions.

Referring to FIG. 5 there is shown an exemplary n on p backside illuminated photodiode array 90 constructed in accordance with the foregoing description of preferred embodiments of the invention. As can be seen, a plurality of metal contacts 92 make an ohmic contact with the n-type collector regions, each of the collector regions defining an individual photodiode of the array. The individual photodiodes are differentiated by the isolation junction regions 38 which are formed by any of the disclosed methods. Overlying each isolation junction region 38 is a passivation layer 94 which may be comprised of wide bandgap CdTe or any suitable wide bandgap passivation material.

It should be pointed out that the invention provides for, in accordance with the in-situ delineation of photodiodes, the in-situ growth of the passivation layer 94. That is, both photodiode delineation and passivation may be accomplished during a single growth run without exposing the structure to the ambient atmosphere and other possible sources of contamination. As a result, the quality of the array of photodiodes is improved.

Overlying the passivation layer 94 is a layer of dielectric 96 As can be seen, the windows which are opened to allow the deposition of the metallic contacts 92 are sized such that the intersection of the n-p isolation homojunctions 40 and the surface of the array is disposed beneath the passivation layer 94. That is, the windows are sized such that the metal contacts 92 do not make an ohmic contact with the intersection of the n-p isolation homojunctions 40 and the surface of the array. Similarly, if the metal contact instead makes an ohmic contact with the aforedescribed heavily implanted CdTe layer, the CdTe is implanted such that the intersection of the junction 40 remains electrically isolated beneath the high resistance of the wide-bandgap CdTe passivation layer.

It should be realized that in the various embodiments of the invention shown above that the isolation junction regions are shown in an unbiased condition. However, it is within the scope of the invention to electrically couple the isolation junction regions to a suitable source of bias voltage for enhancing the operation of the isolation junctions. It should also be realized that the teaching of the invention is applicable to SWIR, MWIR and LWIR radiation responsive arrays constructed of Group II-VI, Group IV-VI or other narrow-bandgap semiconductor material other than HgCdTe. Furthermore, certain methods of the invention, such as those relating to the formation of the isolation junction regions by the inward diffusion of a dopant layer, relate also to photodetecting arrays which are comprised of Group III-V compounds, such as GaAs and AlAs.

Although the invention has been described in the context of presently preferred embodiments it should be realized that the scope of the invention is not meant to be limited to only these presently preferred embodiments. That is, those having ordinary skill in the art may derive modifications to these presently preferred embodiments based on the description given above. Therefore, the present invention is not intended to be limited to only those specific examples disclosed above but is instead meant to be limited only as defined by the appended claims.

What is claimed is:

1. An array of radiation responsive photodiodes comprising:
   a base layer having a first type of electrical conductivity, said base layer being responsive to radiation for absorbing the radiation and generating charge carriers therefrom;
   a collector layer overlying said base layer, said collector layer having a second type of electrical conductivity for collecting charge carriers from said base layer, the interface of a top surface of said base layer and a bottom surface of said collector layer defining a photodiode heterojunction; and
   an isolation junction region thermally formed within at least said collector layer and having a shape selected for differentiating said photodiode heterojunction into a plurality of photodiode heterojunctions, said isolation junction region having an opposite type of conductivity from that of said collector layer.

2. An array of radiation responsive photodiodes as defined in claim 1 wherein said collector layer has a substantially uniform thickness and wherein said isolation junction region extends at least completely through the thickness of said collector layer.

3. An array of radiation responsive photodiodes as defined in claim 2 wherein the thickness is less than approximately two microns.

4. An array of radiation responsive photodiodes as defined in claim 2 wherein an interface of said isolation junction region and said collector layer defines an isolation homojunction and wherein an interface of said isolation junction region and said base layer defines an isotype heterojunction.

5. An array of radiation responsive photodiodes as defined in claim 4 wherein said isolation junction region extends completely through the thickness of said collector layer and into said base layer and wherein an interface of said isolation junction region and said base layer defines an isotype homojunction.

6. An array of radiation responsive photodiodes as defined in claim 4 wherein said base layer comprises HgCdTe having a first energy bandgap and wherein said collector layer comprises HgCdTe having a second energy bandgap which is wider than the bandgap of the underlying base layer.

7. An array of radiation responsive photodiodes as defined in claim 6 and further comprising a passivation layer which overlies at least said isolation junction region including said isolation homojunction.

8. An array of radiation responsive photodiodes as defined in claim 7 wherein said passivation layer is comprised of CdTe.

9. An array of radiation responsive photodiodes as defined in claim 7 wherein said passivation layer is comprised of ZnTe.

10. An array of radiation responsive photodiodes as defined in claim 7 and further comprising:
   a dielectric layer which overlies said passivation layer; and
   a plurality of metallic contacts individual ones of which are conductively coupled to a portion of said collector layer in registration with an underlying individual one of said photodiode heterojunctions.

11. An array of photodiodes as defined in claim 10 wherein each of said metallic contacts makes on ohmic contact with said portion of said collector layer.

12. An array of photodiodes as defined in claim 10 wherein each of said metallic contacts makes an ohmic contact with a conductive portion of said passivation layer, each of the conductive portions of the passivation layer overlying a portion of the collector layer in registration with one of said photodiode heterojunctions, each of the conductive portions of the passivation layer being conductively coupled to the underlying portion of the conductor layer.

13. A method of fabricating an array of radiation responsive photodiodes comprising the steps of:
   forming a radiation absorbing base layer having a first type of electrical conductivity;
   forming a collector layer over a surface of the base layer, the collector layer having a second type of electrical conductivity, the interface between the base layer and the collector layer defining a p-n heterojunction or an n-p heterojunction; and
   differentiating the heterojunction into a plurality of heterojunctions;
   wherein the step of differentiating includes a step of converting a portion of at least the collector layer to an opposite type of electrical conductivity by a thermally driven process, the converted portion having a shape selected for defining an isolation junction region that physically isolates and also electrically isolates individual ones of the plurality of heterojunctions one from another.

14. A method as defined in claim 13 wherein the step of forming a base layer is accomplished by forming a p-type layer comprised of a mercury compound and the step of forming a collector layer is accomplished by forming an n-type layer comprised of a mercury compound.

15. A method as defined in claim 14 wherein the step of converting is accomplished by the steps of:
   providing a source of electromagnetic radiation having a wavelength or wavelengths which are absorbed within the collector layer for heating the collector layer;
   selectively illuminating the surface of the collector layer with the source for forming a pattern of illuminated and nonilluminated regions, the nonilluminated regions corresponding to desired positions of individual photodiodes; and
   extracting mercury from the heated, illuminated regions thereby creating mercury vacancies for type-converting the n-type mercury compound to a p-type mercury compound.

16. A method as defined in claim 15 wherein the step of extracting is accomplished in a vacuum.

17. A method as defined in claim 15 wherein the step of extracting includes a step of flowing a gas comprised of hydrogen over the surface of the collector layer.

18. A method as defined in claim 13 wherein the step of forming a collector layer is accomplished by forming a collector layer which has a thickness of less than approximately two microns.

19. A method as defined in claim 11 wherein the steps of converting is accomplished by the steps of:
   providing a source of electromagnetic radiation having a wavelength or wavelengths which are absorbed within the collector layer for heating the collector layer;
   selectively depositing a dopant layer upon the surface of the collector layer, the dopant layer being deposited upon the surface where a photodiode is not desired, the dopant comprising atoms selected for type-converting the underlying collector layer to an opposite type of electrical conductivity;
   illuminating the dopant layer and the underlying surface of the collector layer with the source; and
   diffusing the dopant layer into the underlying collector layer thereby type-converting the underlying collector layer to an opposite type of conductivity.

20. A method as defined in claim 13 wherein the step of forming a base layer is accomplished by forming an n-type layer comprised of a mercury compound and the step of forming a collector layer is accomplished by forming a p-type layer comprised of a mercury compound.

21. A method as defined in claim 20 wherein the step of converting is accomplished by the steps of:
   flowing a gas over a surface of the collector layer, the gas comprising molecules which include atoms of an n-type dopant;
   providing a source of electromagnetic radiation having a wavelength or wavelengths selected for decomposing the gas molecules and liberating the n-type dopant atoms therefrom;
   selectively illuminating the surface of the collector layer with the source for forming a pattern of illuminated and nonilluminated regions, the nonilluminated regions corresponding to desired positions of individual photodiodes, the gas flow being decomposed in the illuminated regions;
   selectively depositing the liberated dopant atoms over the surface of the collector layer, the dopant atoms being deposited upon the surface only where a photodiode is not desired; and
   diffusing the deposited dopant atoms into the underlying collector layer thereby type-converting the underlying collector layer to an n-type of conductivity.

22. A method as defined in claim 13 and further comprising a step of depositing a passivation layer at least over the converted portions of the collector layer.

23. An array of infrared radiation responsive double layer heterojunction photodiodes comprising:
   a substrate;

a base layer comprised of HgCdTe overlying said substrate, said base layer having a first type of electrical conductivity, said base layer being responsive to radiation for absorbing the radiation and generating charge carriers therefrom;

a substantially planar collector layer comprised of HgCdTe overlying said base layer, said collector layer having a second type of electrical conductivity for collecting charge carriers from said base layer, the interface of a top surface of said base layer and a bottom surface of said collector layer defining a photodiode heterojunction; and an isolation junction region thermally formed within at least said collector layer and having a shape selected for differentiating said photodiode heterojunction into a plurality of photodiode heterojunctions, said isolation junction region having an opposite type of conductivity from that of said collector layer.

24. An array of photodiodes as defined in claim 23 wherein said collector layer has a substantially uniform thickness of less than approximately two microns and wherein said isolation junction region has a thickness that extends completely through the thickness of said collector layer.

25. An array of photodiodes as defined in claim 24 wherein an interface of said isolation junction region and said collector layer defines an isolation homojunction and wherein an interface of said isolation junction region and said base layer defines an isotype heterojunction.

26. An array of photodiodes as defined in claim 25 wherein said isolation junction region extends completely through the thickness of said collector layer and into said base layer and wherein an interface f said isolation junction region and said base layer defines an isotype homojunction.

27. An array of photodiodes as defined in claim 25 and further comprising a passivation layer which overlies at least said isolation junction region including said isolation homojunction.

* * * * *